United States Patent
Hishinuma et al.

(10) Patent No.: US 10,524,058 B2
(45) Date of Patent: Dec. 31, 2019

(54) PIEZOELECTRIC MICROPHONE

(71) Applicant: FUJIFILM Corporation, Tokyo (JP)

(72) Inventors: Yoshikazu Hishinuma, Kanagawa (JP); Takayuki Naono, Kanagawa (JP); Takahiro Sano, Kanagawa (JP)

(73) Assignee: FUJIFILM Corporation, Tokyo (JP)

(*) Notice: Subject to any disclaimer, the term of this patent is extended or adjusted under 35 U.S.C. 154(b) by 0 days.

(21) Appl. No.: 16/365,119

(22) Filed: Mar. 26, 2019

(65) Prior Publication Data
US 2019/0222941 A1 Jul. 18, 2019

Related U.S. Application Data

(63) Continuation of application No. PCT/JP2017/033338, filed on Sep. 14, 2017.

(30) Foreign Application Priority Data

Sep. 29, 2016 (JP) .................. 2016-191547

(51) Int. Cl.
*H04R 17/02* (2006.01)
*H01L 41/047* (2006.01)
(Continued)

(52) U.S. Cl.
CPC ......... *H04R 17/02* (2013.01); *H01L 41/0478* (2013.01); *H01L 41/1138* (2013.01);
(Continued)

(58) Field of Classification Search
CPC .... H04R 17/005; H04R 17/02; H04R 17/025; H04R 19/016; H04R 19/04; H04R 2217/01; H04R 2201/003; H01L 41/1138
(Continued)

(56) References Cited

U.S. PATENT DOCUMENTS 8,311,248 B2* 11/2012 Bai .................. H04R 31/00
381/190
8,363,864 B2* 1/2013 Chung ............... H04R 17/005
29/25.35
(Continued)

FOREIGN PATENT DOCUMENTS

EP 0 718 900 A2 6/1996
JP H08-181360 A 7/1996
(Continued)

OTHER PUBLICATIONS

International Search Report issued in PCT/JP2017/033338; dated Nov. 14, 2017.
(Continued)

*Primary Examiner* — Huyen D Le
(74) *Attorney, Agent, or Firm* — Studebaker & Brackett PC (57) ABSTRACT

A piezoelectric microphone includes a plate, a support portion that is provided around the plate, connection portions that connect the plate and the support portion on two or more sides of the plate, and a detection portion including a lower electrode, a piezoelectric film, and an upper electrode which are stacked in this order. The detection portion is stacked on the connection portion. An inflection point of a cross-sectional deformation curve in a case in which the plate and the connection portion are deformed by sound pressure is present in a region in which the detection portion is not stacked.

10 Claims, 10 Drawing Sheets

(51) Int. Cl.
*H01L 41/113* (2006.01)
*H01L 41/187* (2006.01)
*H04R 19/04* (2006.01)

(52) U.S. Cl.
CPC ....... *H01L 41/1876* (2013.01); *H04R 17/025* (2013.01); *H04R 19/04* (2013.01); *H04R 2201/003* (2013.01); *H04R 2217/01* (2013.01)

(58) Field of Classification Search
USPC ....... 381/114, 369, 173, 174, 175, 190, 191; 29/25.35
See application file for complete search history.

(56) References Cited

U.S. PATENT DOCUMENTS

2007/0147650 A1 6/2007 Lee et al.
2015/0162523 A1 6/2015 Umeda et al.

FOREIGN PATENT DOCUMENTS

| JP | 4249778 B2 | 4/2009 |
| JP | 2011-097311 A | 5/2011 |
| JP | 2013-098724 A | 5/2013 |
| WO | 2015/083572 A1 | 6/2015 |

OTHER PUBLICATIONS

Written Opinion issued in PCT/JP2017/033338; dated Nov. 14, 2017.

* cited by examiner

$W_t = W_1$
$W_p = \pi^{1/2} \cdot R$

PIEZOELECTRIC MICROPHONE

CROSS-REFERENCE TO RELATED APPLICATIONS

This application is a continuation application of International Application No. PCT/JP2017/033338, filed Sep. 14, 2017, the disclosure of which is incorporated herein by reference in its entirety. Further, this application claims priority from Japanese Patent Application No.2016-191547, filed Sep. 29, 2016, the disclosure of which is incorporated herein by reference in its entirety.

BACKGROUND OF THE INVENTION

1. Field of the Invention

The present invention relates to a piezoelectric microphone.

2. Description of the Related Art

In recent years, silicon microphones manufactured by micro-electro-mechanical systems (MEMS) technology have been widely used as small microphones used in, for example, mobile phones or notebook computers. The silicon microphone has the characteristic that it is significantly smaller (a package size is equal to or less than about 3 mm square) than a condenser microphone according to the related art. The detection principle of the silicon microphone is an electrostatic type and the silicon microphone has a structure having two layers of diaphragms. Damping caused by an air layer between the diaphragms becomes a main noise source and it is difficult to further improve the SN ratio.

Therefore, in order to further improve the SN ratio in a small microphone, a MEMS microphone has been developed which avoids the two-layer diaphragm structure and whose detection principle is a piezoelectric type (for example, WO2015/083572A and JP4249778B).

SUMMARY OF THE INVENTION

WO2015/083572A describes a microphone in which a square diaphragm is held in a double-supported beam, a detection portion comprising a piezoelectric film is stacked on the diaphragm, and the width of the piezoelectric film is less than the width of the diaphragm to obtain high sensitivity. In this configuration, the stress or rigidity of the piezoelectric film of the detection portion and an electrode has a strong influence on the warpage of the entire double-supported beam. It is supposed that the width of the piezoelectric film is reduced to increase vibration in the piezoelectric film, thereby increasing sensitivity. However, in this structure, in a case in which an inflection point of a cross-sectional deformation curve at the time of the deformation of the diaphragm by sound pressure is present in a region in which the detection portion is stacked, both an upward warping portion and a downward warping portion are included in the detection portion. In a case in which detection is performed by the piezoelectric film, detection signals generated in each region cancel each other and sensitivity is reduced, which results in a reduction in the SN ratio.

JP4249778B discloses a microphone including a diaphragm and a flexible spring structure portion that is formed around the diaphragm. In this configuration, since the spring structure portion is sufficiently flexible, the diaphragm is not deformed and a region in which deformation occurs is limited to the spring structure portion. However, in this structure, an upward warping portion and a downward warping portion are included in the spring structure portion. Therefore, in a case in which detection is performed by the piezoelectric film, detection signals generated in each region cancel each other out and sensitivity is reduced, which results in a reduction in the SN ratio.

The invention has been made in view of the above-mentioned problems and an object of the invention is to provide a piezoelectric microphone with a high SN ratio.

According to the invention, there is provided a piezoelectric microphone comprising: a plate; a support portion that is provided around the plate; connection portions that connect the plate and the support portion on two or more sides of the plate; and a detection portion including a lower electrode, a piezoelectric film, and an upper electrode which are stacked in this order. The detection portion is stacked on the connection portion. An inflection point of a cross-sectional deformation curve in a case in which the plate and the connection portion are deformed by sound pressure is present in a region in which the detection portion is not stacked.

In the piezoelectric microphone according to the invention, preferably, a width of the connection portion is less than a width of the plate.

Preferably, the connection portion and the plate have the same thickness.

Preferably, the connection portion has a rectangular shape.

Preferably, the piezoelectric microphone is a double-supported beam type that has the connection portion on each of two opposite sides forming a set.

Preferably, the piezoelectric microphone satisfies the following Conditional Expression (1):

$$L1/Lp < 0.37 \times (Wt/Wp) + 0.23 \quad (1)$$

where L1: a length of the connection portion
Lp: a length of the plate
Wt: a sum of the widths of the connection portions
Wp: a width of the plate.

The sum of the widths of the connection portions on one side of the plate is preferably equal to or greater than 30% and less than 100% of the width of the plate and is more preferably equal to or greater than 40% and less than 80% of the width of the plate.

Preferably, piezoelectric film the piezoelectric film has a relative permittivity of 1000 or more.

Preferably, the piezoelectric film is made of Nb-PZT.

The piezoelectric microphone according to the invention comprises a plate, a support portion that is provided around the plate, connection portions that connect the plate and the support portion in two or more sides of the plate, and a detection portion including a lower electrode, a piezoelectric film, and an upper electrode which are stacked in this order. The detection portion is stacked on the connection portion. An inflection point of a cross-sectional deformation curve in a case in which the plate and the connection portion are deformed by sound pressure is present in a region in which the detection portion is not stacked. Therefore, both an upward warping portion and a downward warping portion are not included in the detection portion. As a result, detection signals generated in each region do not cancel each other and sensitivity is not reduced. Therefore, it is possible to provide a piezoelectric microphone with high sensitivity and a high SN ratio.

DESCRIPTION OF THE PREFERRED EMBODIMENTS

Figure 1:
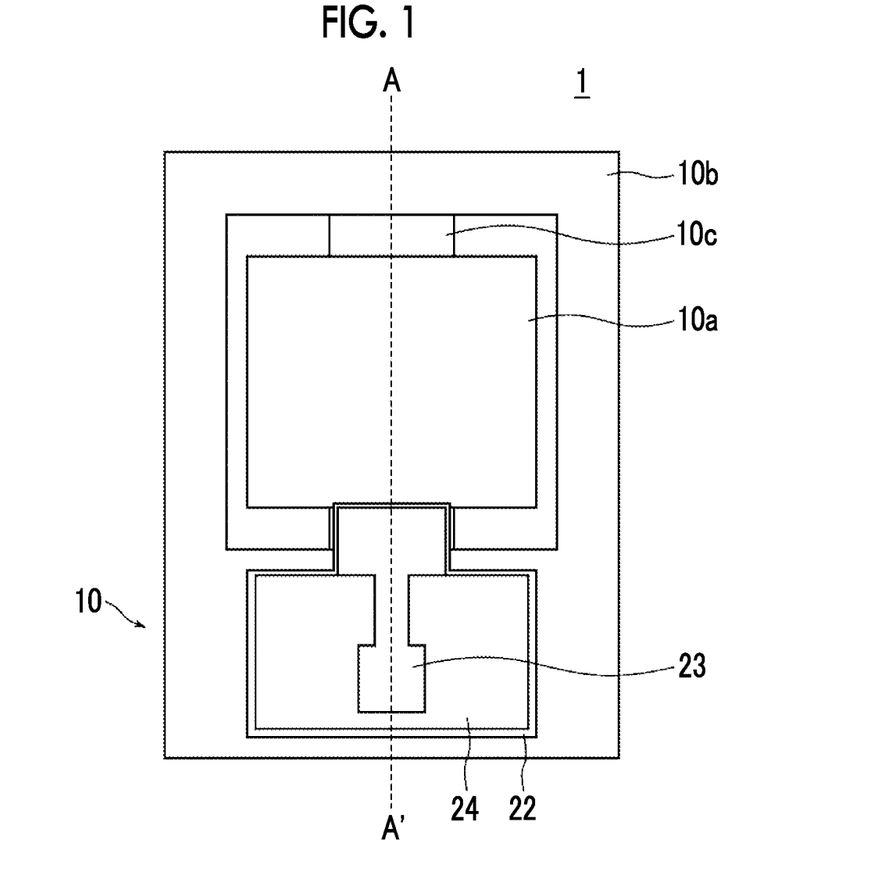
FIG. 1 is a top view illustrating a piezoelectric microphone according to a first embodiment of the invention.

Hereinafter, embodiments of the invention will be described in detail with reference to the drawings. FIG. 1 is a top view illustrating a piezoelectric microphone according to a first embodiment of the invention and FIG. 2 is a cross-sectional view taken along the line A-A' of FIG. 1.

Figure 2:
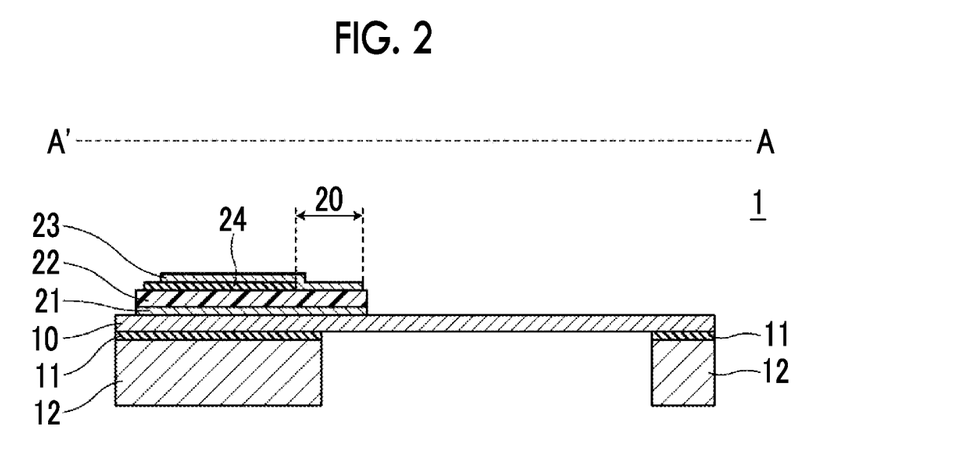
FIG. 2 is a cross-sectional view taken along the line A-A' of FIG. 1.

As illustrated in FIGS. 1 and 2, a piezoelectric microphone 1 according to this embodiment comprises a plate 10a, a support portion 10b that is provided around the plate 10a, connection portions 10c that connect the plate 10a and the support portion 10b on two or more sides of the plate 10a, and a detection portion 20.

As illustrated in FIG. 2, the plate 10a, the support portion 10b, and the connection portions 10c are integrally formed in an insulating silicon layer 10. The detection portion 20 including a lower electrode 21, a piezoelectric film 22, and an upper electrode 23 which are stacked in this order is stacked on an upper surface of the connection portion 10c of the silicon layer 10. In the detection portion 20, the piezoelectric film 22 that is stacked integrally with the connection portion 10c converts vibration generated in the connection portion 10c into an electric signal and the electric signal is extracted from the lower electrode 21 and the upper electrode 23. It is preferable that the piezoelectric film 22 is made of, for example, lead zirconate titanate (PZT), niobium-doped lead zirconate titanate (Nb-PZT), aluminum nitride (AlN), or zinc oxide (ZnO).

In addition, the lower electrode 21, the piezoelectric film 22, and the upper electrode 23 are formed not only on the upper surface of the connection portion 10c of the silicon layer 10 but also on an upper surface of the support portion 10b in order to form a pad (connection portion) for connection to, for example, an external electronic substrate. In a region other than the upper surface of the connection portion 10c of the silicon layer 10, an insulating layer 24 is stacked between the piezoelectric film 22 and the upper electrode 23. A region in which the insulating layer 24 is stacked does not function as the detection portion 20 to prevent the occurrence of parasitic capacitance.

In addition, a bridge pier portion 12 made of silicon is stacked on a lower surface of the connection portion 10c of the silicon layer 10 with an insulating layer 11 interposed therebetween. As described above, the plate 10a, the support portion 10b, and the connection portions 10c are integrally formed by the silicon layer 10 and the connection portion 10c and the plate 10a have the same thickness, which makes it easy to design and manufacture the piezoelectric microphone 1.

The piezoelectric microphone 1 configured as described above has a double-supported beam structure. A double-supported beam includes the wide-area plate 10a for receiving sound pressure and a pair of rectangular connection portions 10c that are opposite to each other and are used to connect the plate 10a to the support portion 10b.

Distortion caused by sound pressure occurs in both areas of the plate 10a and the connection portion 10c and is particularly concentrated on the connection portion 10c. Therefore, the detection portion 20 that detects vibration is formed on the connection portion 10c in order to maximize sensitivity. In this embodiment, the detection portion 20 is stacked on only one of the pair of connection portions 10c. In addition, it is preferable that the area of the detection portion 20 on the connection portion 10c is as large as possible in order to increase sensitivity.

The piezoelectric microphone 1 can be manufactured by MEMS technology. However, it is preferable that a device size is as small as possible in order to increase the number of devices acquired per wafer. The area of a portion that receives sound pressure needs to be sufficiently large in order to obtain sufficient sensitivity to sound pressure. The size of a device structure is determined by these contrary factors and it is preferable that a sensor portion (the plate 10a and the connection portion 10c) is designed with a size equal to or less than 1 mm square.

In addition, it is desirable that the thickness of the silicon layer 10 forming the plate 10a and the connection portions 10c is in the range of 1 μm to 20 μm in order to satisfy three points, that is, 1: high sensitivity, 2: a wide frequency band, and 3: wafer process compatibility. Further, it is desirable that the thickness of the piezoelectric film 22 is in the range of 0.1 μm to 4 μm in terms of required sensitivity and a process cost.

The piezoelectric microphone 1 according to this embodiment is configured such that an inflection point of a cross-sectional deformation curve in a case in which the plate 10a and the connection portion 10c are deformed by sound pressure is present in a region in which the detection portion 20 is not stacked.

Figure 3:
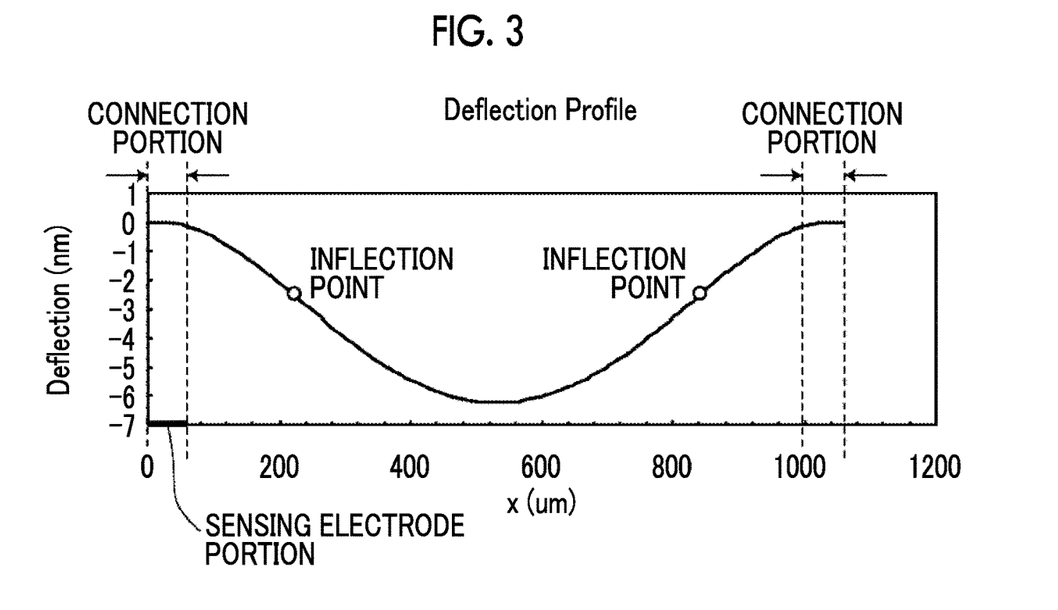
FIG. 3 is a graph illustrating a cross-sectional deformation curve in a case in which a plate and a connection portion are deformed by sound pressure.

FIG. 3 is a graph illustrating a cross-sectional deformation curve in a case in which the plate and the connection portion are deformed by sound pressure. For example, in the piezoelectric microphone 1 according to this embodiment, the plate 10a has a width of about 940 µm and a length of about 940 µm and the connection portion 10c has a width of about 400 µm and a length of about 60 µm. In the configuration according to this embodiment, since the plate 10a is deformed by sound pressure, the inflection point can be generated in the region in which the detection portion 20 is not stacked.

In a case in which the inflection point is present in the region in which the detection portion 20 is not stacked, both an upward warping portion and a downward warping portion are included in the detection portion 20. In a case in which detection is performed by the piezoelectric film 22, detection signals generated in each region cancel each other and sensitivity is reduced, which results in a reduction in the SN ratio. However, the above-mentioned configuration in which the inflection point is present in the region in which the detection portion 20 is not stacked makes it possible to obtain the piezoelectric microphone 1 with a high SN ratio, without causing the above-mentioned problems.

Figure 4:
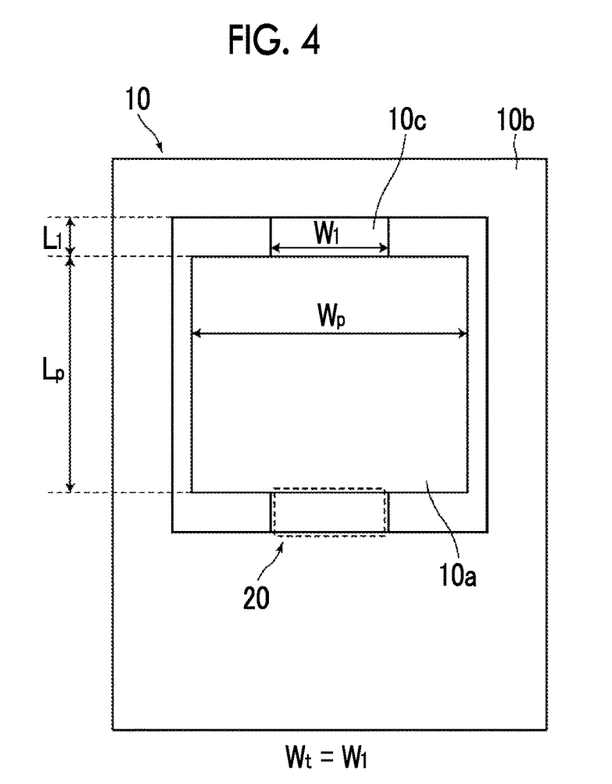
FIG. 4 is a top view illustrating the vicinity of the plate of the piezoelectric microphone according to the first embodiment.
Figure 5:
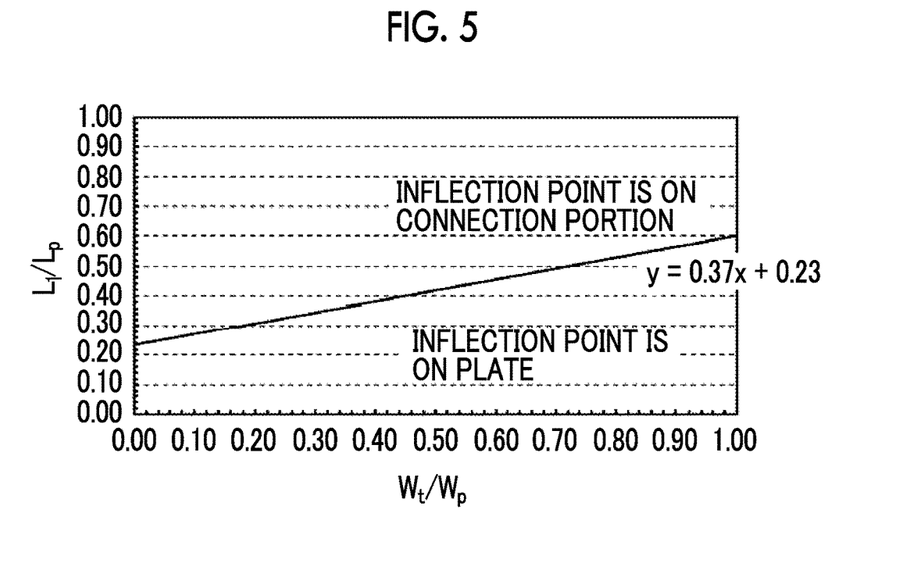
FIG. 5 is a graph illustrating the relationship between the width and length of the plate and the connection portion and the position of an inflection point.

Next, the conditions in which the inflection point is present in a region in which the detection portion 20 is not stacked in the sensor portion will be described. FIG. 4 is a top view illustrating the vicinity of the plate of the piezoelectric microphone according to the first embodiment and FIG. 5 is a graph illustrating the relationship between the width and length of the plate and the connection portion and the position of the inflection point. In addition, the graph is obtained by finite element calculation.

As illustrated in FIG. 4, in a case in which the length of the connection portion 10c is L1, the length of the plate 10a is Lp, the sum of the widths of the connection portions 10c is Wt, the width of the plate 10a is Wp, and the plate 10a and the connection portion 10c are made of the same material and have the same thickness, the relationship between the width and length of the plate 10a and the connection portion 10c and the position of the inflection point is a relationship indicated by the graph illustrated in FIG. 5.

That is, in a case in which the following Conditional Expression (1) is satisfied, the inflection point can be in the region in which the detection portion 20 is not stacked.

$$L1/Lp < 0.37 \times (Wt/Wp) + 0.23 \quad (1)$$

Figure 6:
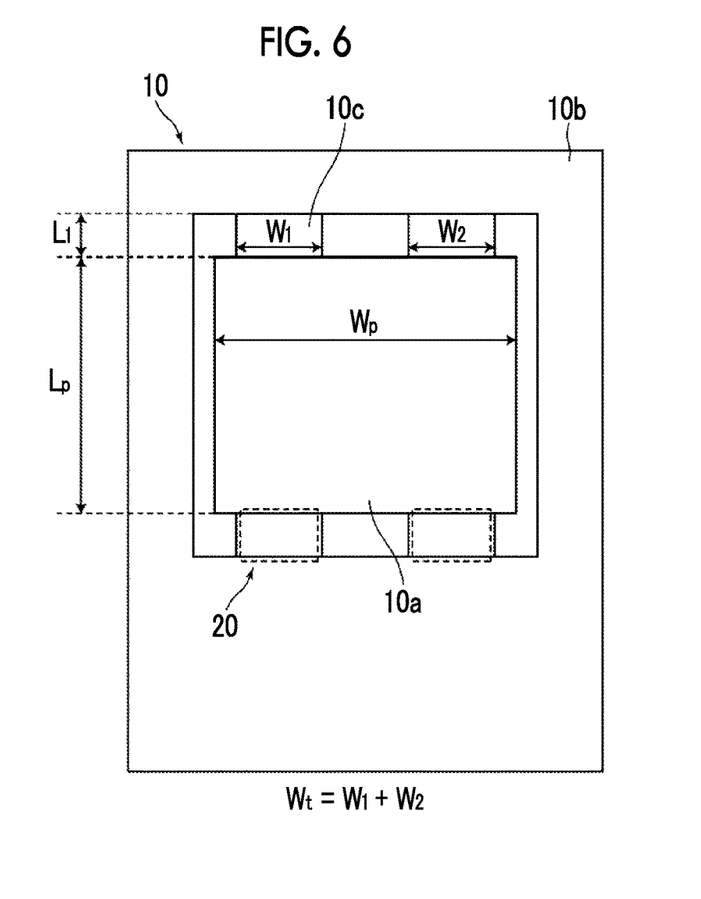
FIG. 6 is a top view illustrating another configuration of the piezoelectric microphone according to the first embodiment.
Figure 7:
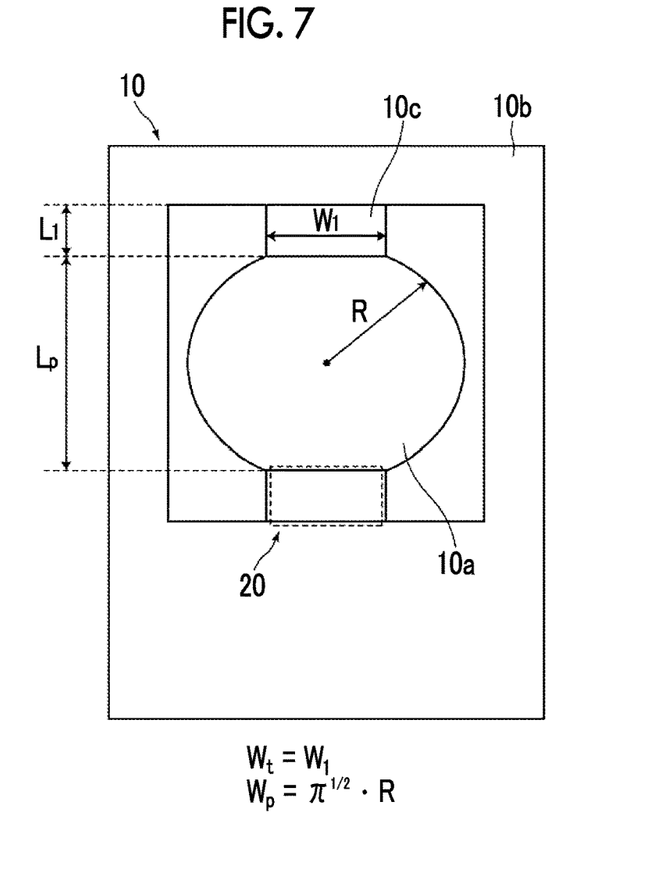
FIG. 7 is a top view illustrating still another configuration of the piezoelectric microphone according to the first embodiment.

In addition, the relationship of Conditional Expression (1) is established even in a case in which two or more pairs of opposite connection portions 10c are provided as illustrated in FIG. 6. Further, even in a case in which the plate 10a is formed in a circular or elliptical shape as illustrated in FIG. 7 or even in a case in which the plate 10a and the connection portion 10c are made of different materials or have different thicknesses, it is possible to appropriately set the conditions in which the inflection point is present in the region in which the detection portion 20 is not stacked and to respond to the case.

Figure 8:
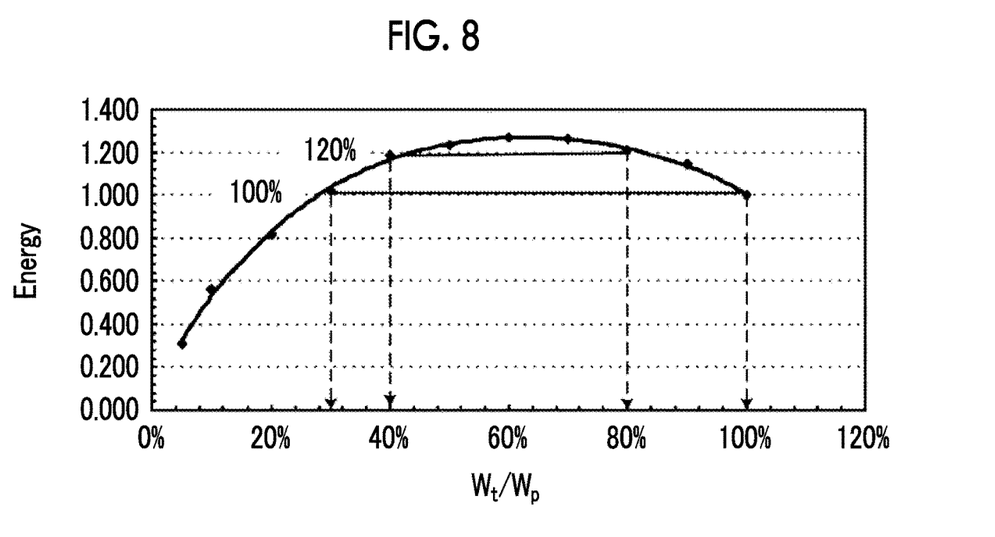
FIG. 8 is a graph illustrating a relationship between sensitivity and the ratio of the sum of the widths of the connection portions to the width of the plate.

Next, the relationship between sensitivity and the ratio of the sum of the widths of the connection portions 10c to the width of the plate 10a will be described. FIG. 8 is a graph illustrating the relationship between sensitivity and the ratio of the sum of the widths of the connection portions to the width of the plate. In addition, the following description is also applied to any of the aspects illustrated in FIGS. 4, 6, and 7.

In the graph illustrated in FIG. 8, the horizontal axis indicates the ratio of the sum of the widths of the connection portions 10c to the width of the plate 10a on one side of the plate 10a and the vertical axis indicates energy accumulated in the piezoelectric film 22 in a case in which a certain degree of sound pressure is received. The energy is standardized in a case in which the sum of the widths of the connection portions 10c is equal to the width of the plate 10a.

In the relationship, in order to maintain a frequency band, the thickness of the plate 10a and the connection portion 10c is changed at the same time as the width of the connection portion 10c is changed such that a resonance frequency is constant.

In a case in which the voltage generated in one detection portion 20 is simply considered, as the width of the connection portion 10c increases, distortion in a case in which sound pressure is received increases and a generated voltage increases. However, since the area of the electrode is reduced, the amount of charge generated is reduced and the accumulated energy is reduced. In contrast, in a case in which the width of the connection portion 10c increases, the voltage generated per detection portion 20 is reduced. However, the area of the electrode increases and the amount of charge generated increases.

In the piezoelectric microphone 1 according to this embodiment, in a case in which the ratio of the sum of the widths of the connection portions 10c to the width of the plate 10a is about 60%, the amount of energy accumulated is the maximum as illustrated in FIG. 8.

It is desirable to ensure the minimum amount of accumulated energy in a case in which the ratio of the sum of the widths of the connection portions 10c to the width of the plate 10a is 100%, that is, the width of the plate 10a is equal to the sum of the widths of the connection portions 10c. Therefore, it is preferable that the sum of the widths of the connection portions 10c on one side of the plate is equal to or greater than 30% and less than 100% of the width of the plate 10a.

In addition, in a case in which the amount of accumulated energy is 20% more than the amount of accumulated energy in a case in which the width of the plate 10a is equal to the sum of the widths of the connection portions 10c, a design margin can be obtained. Therefore, it is preferable that the sum of the widths of the connection portions 10c on one side of the plate is equal to or greater than 40% and less than 80% of the width of the plate.

Figure 9:
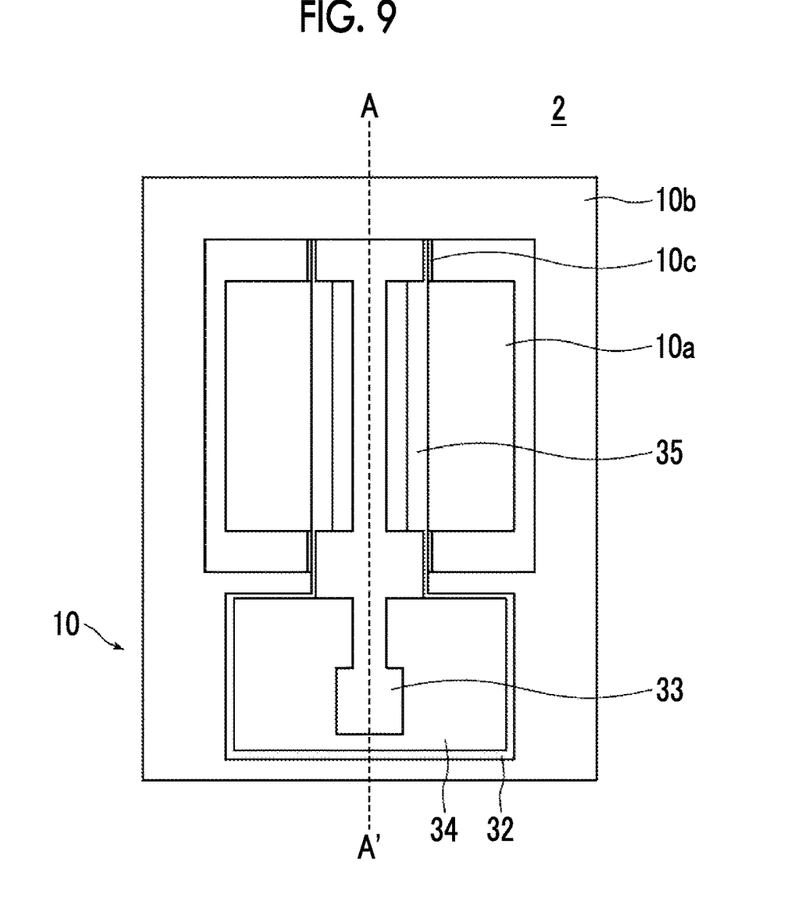
FIG. 9 is a top view illustrating a piezoelectric microphone according to a second embodiment of the invention.
Figure 10:
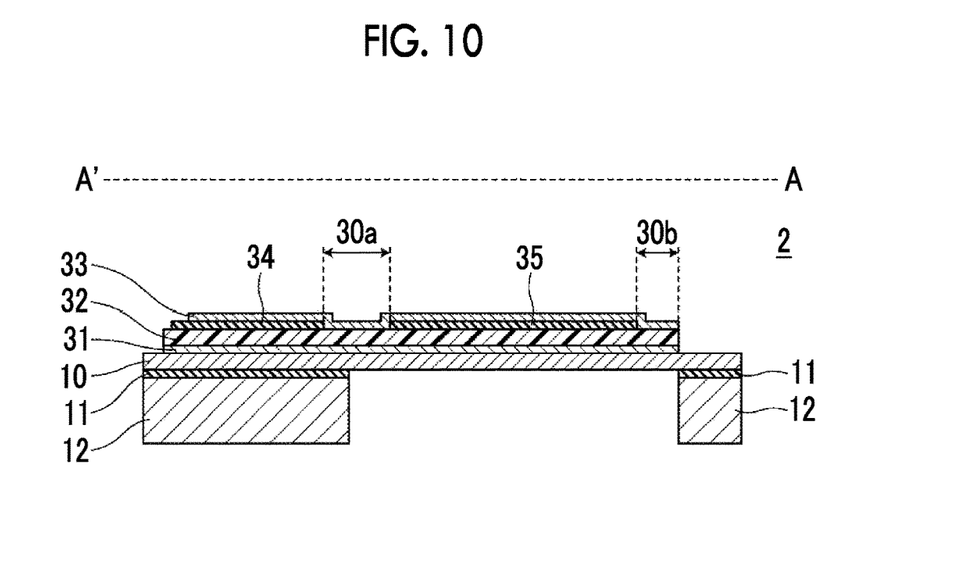
FIG. 10 is a cross-sectional view taken along the line A-A' of FIG. 9.
Figure 11:
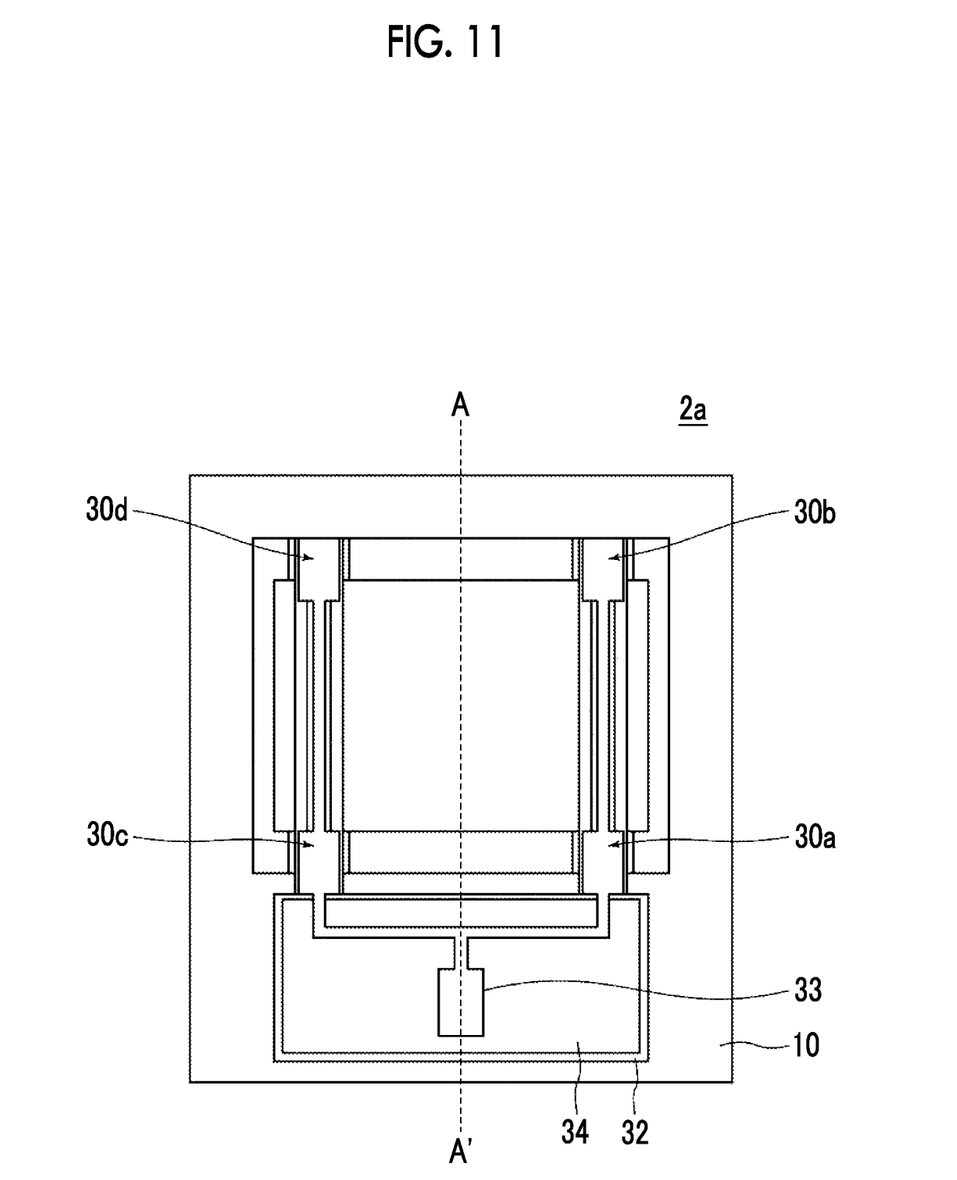
FIG. 11 is a top view illustrating another configuration of the piezoelectric microphone according to the second embodiment.
Figure 12:
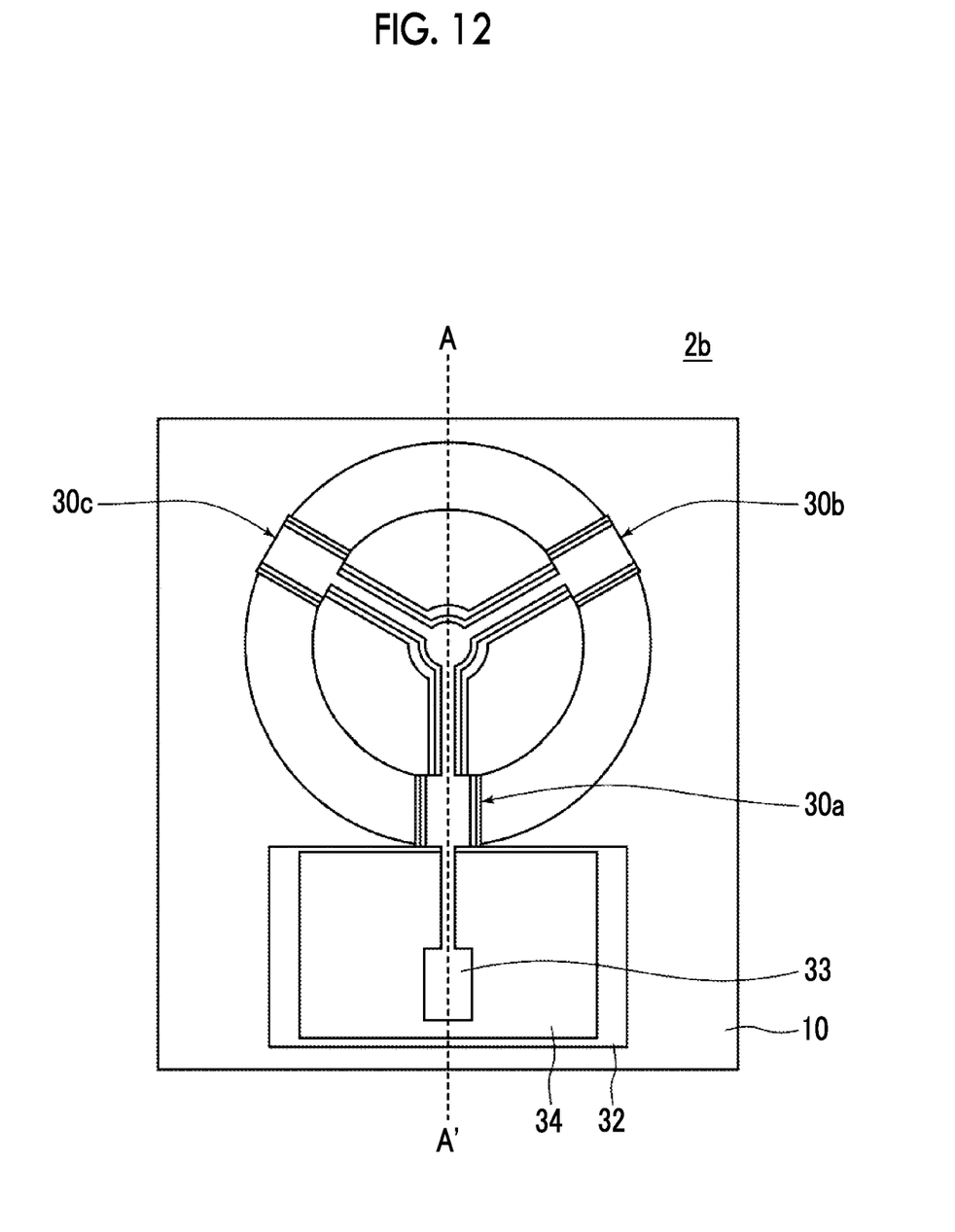
FIG. 12 is a top view illustrating still another configuration of the piezoelectric microphone according to the second embodiment.

Next, a second embodiment of the invention will be described. FIG. 9 is a top view illustrating a piezoelectric microphone according to the second embodiment of the invention. FIG. 10 is a cross-sectional view taken along the line A-A' of FIG. 9. FIG. 11 is a top view illustrating another configuration of the piezoelectric microphone according to the second embodiment. FIG. 12 is a top view illustrating still another configuration of the piezoelectric microphone according to the second embodiment.

In the first embodiment, the detection portion 20 is stacked on only one of the pair of connection portions 10c. However, in this embodiment, detection portions 30a and 30b are stacked on a pair of connection portions 10c and are connected in parallel to each other. Here, the description of the same portions as those in the piezoelectric microphone 1 according to the first embodiment will not be repeated.

As illustrated in FIGS. 9 and 10, a piezoelectric microphone 2 according to this embodiment comprises a plate 10a, a support portion 10b that is provided around the plate 10a, connection portions 10c that connect the plate 10a and the support portion 10b on two or more sides of the plate 10a, and the detection portions 30a and 30b. As illustrated in FIG. 10, the detection portions 30a and 30b, each of which includes a lower electrode 31, a piezoelectric film 32, and an upper electrode 33 stacked in this order, are stacked on an upper surface of the connection portion 10c of the silicon layer 10.

The lower electrode 31, the piezoelectric film 32, and the upper electrode 33 are formed not only on the upper surface of the connection portion 10c of the silicon layer 10 but also on the upper surfaces of the plate 10a and the support portion 10b in order to form a pad (connection portion) for connection to, for example, an external electronic substrate and to connect the two detection portions 30a and 30b. In a region of the upper surface of the support portion 10b of the silicon layer 10, an insulating layer 34 is stacked between the piezoelectric film 32 and the upper electrode 33. In addition, in a region of the upper surface of the plate 10a of the silicon layer 10, an insulating layer 35 is stacked between the piezoelectric film 32 and the upper electrode 33. A region in which the insulating layers 34 and 35 are stacked do not function as the detection portions 30a and 30b to prevent the occurrence of parasitic capacitance.

As such, since the detection portions 30a and 30b are connected in parallel to each other, it is possible to increase electric capacity and to reduce the influence of the parasitic capacitance of wires or an amplifying circuit provided in the subsequent stage.

As illustrated in FIG. 11, a plurality of pairs of connection portions 10c are provided so as to be connected in parallel to each other. In this case, it is possible to obtain higher electric capacity. In addition, the plate 10a does not need to have a rectangular shape and may have other shapes, such as a circular shape, an elliptical shape, and a polygonal shape, as illustrated in FIG. 12.

Figure 13:
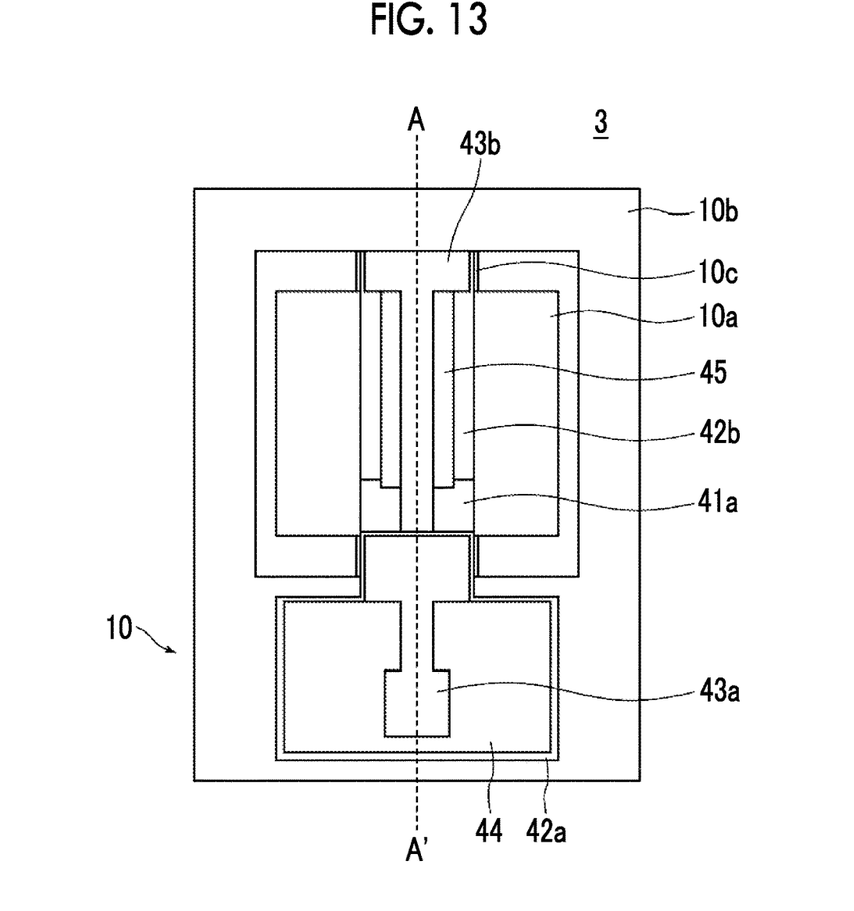
FIG. 13 is a top view illustrating a piezoelectric microphone according to a third embodiment of the invention.
Figure 14:
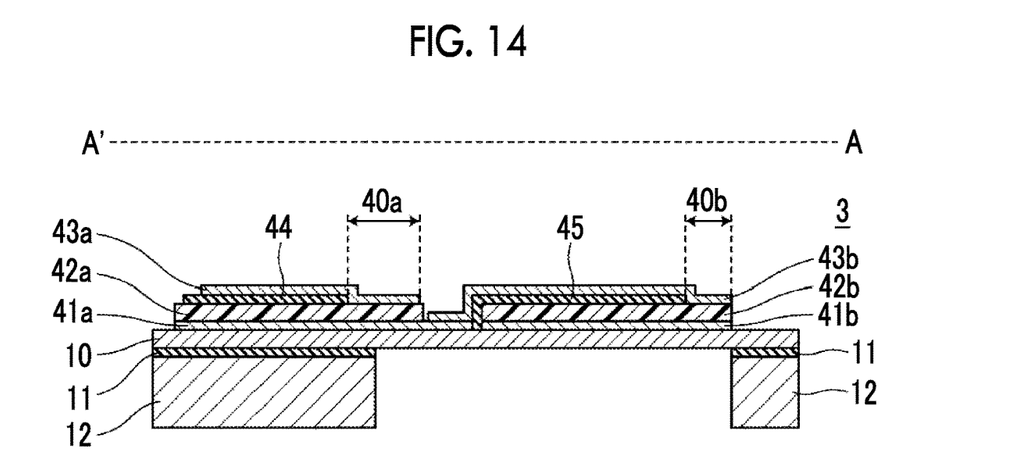
FIG. 14 is a cross-sectional view taken along the line A-A' of FIG. 13.
Figure 15:
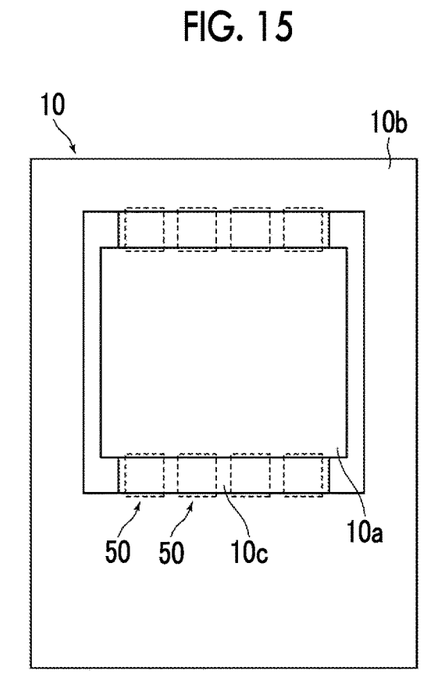
FIG. 15 is a top view illustrating still another configuration of the piezoelectric microphone according to the third embodiment.

Next, a third embodiment of the invention will be described. FIG. 13 is a top view illustrating a piezoelectric microphone according to the third embodiment of the invention. FIG. 14 is a cross-sectional view taken along the line A-A' of FIG. 13. FIG. 15 is a top view illustrating another configuration of the piezoelectric microphone according to the third embodiment.

In the first embodiment, the detection portion 20 is stacked on only one of the pair of connection portions 10c. However, in this embodiment, detection portions 40a and 40b are stacked on a pair of connection portions 10c and are connected in series to each other. Here, the description of the same portions as those in the piezoelectric microphone 1 according to the first embodiment will not be repeated.

As illustrated in FIGS. 13 and 14, a piezoelectric microphone 3 according to this embodiment comprises a plate 10a, a support portion 10b that is provided around the plate 10a, connection portions 10c that connect the plate 10a and the support portion 10b on two or more sides of the plate 10a, and the detection portions 40a and 40b. As illustrated in FIG. 14, the detection portions 40a and 40b including lower electrodes 41a and 41b, piezoelectric films 42a and 42b, and upper electrodes 43a and 43b which are stacked in this order, respectively, are stacked on an upper surface of the connection portion 10c of the silicon layer 10.

The lower electrodes 41a and 41b, the piezoelectric films 42a and 42b, and the upper electrodes 43a and 43b are formed not only on the upper surface of the connection portion 10c of the silicon layer 10 but also on the upper surfaces of the plate 10a and the support portion 10b in order to form a pad (connection portion) for connection to, for example, an external electronic substrate and to connect the two detection portions 40a and 40b. In a region of the upper surface of the support portion 10b of the silicon layer 10, an insulating layer 44 is stacked between the piezoelectric film 42a and the upper electrode 43a. In addition, in a region of the upper surface of the plate 10a of the silicon layer 10, an insulating layer 45 is stacked between the piezoelectric film 42b and the upper electrode 43b. The regions in which the insulating layers 44 and 45 are stacked do not function as the detection portions 40a and 40b to prevent the occurrence of parasitic capacitance. Further, the lower electrodes 41a and 41b are insulated from each other by the insulating layer 45 and the lower electrode 41a of the detection portion 40a is connected to the upper electrode 43b of the detection portion 40b.

As such, since the detection portions 40a and 40b are connected in series to each other, the actual electric capacity is reduced, but the voltages generated from the detection portions 40a and 40b are added to increase sensitivity. The number of detection portions is desired to be increased as large as possible in order to maximize an output voltage in series connection. However, in this case, the actual electric capacity is reduced. There is a minimum electric capacity required to prevent the influence of parasitic capacitance. It is necessary to maximize the amount of energy accumulated in the piezoelectric film in a case in which sound pressure is received, in order to maximize the output voltage under the restriction.

Therefore, a high-permittivity piezoelectric material with a relative permittivity of 1000 or more, such as Nb-PZT ("Preparation of Nb doped PZT film by RF sputtering", Solid State Communications 149 (2009) 1799-1802), is used to achieve a sufficient electric capacity margin and to actively use the design of direct connection.

In addition, in a case in which sensitivity is increased by direct connection, a plurality of detection portions 50 are formed in one connection portion 10c and are connected in series to each other as illustrated in FIG. 15, which makes it possible to increase sensitivity.

Figure 16:
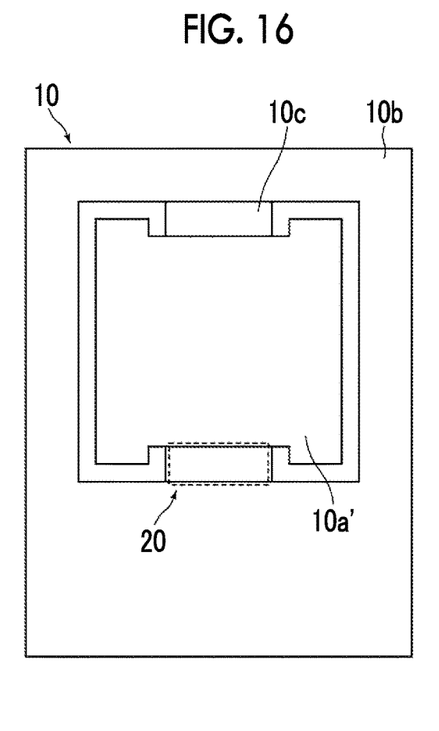
FIG. 16 is a top view illustrating another configuration of the piezoelectric microphone according to the invention.
Figure 17:
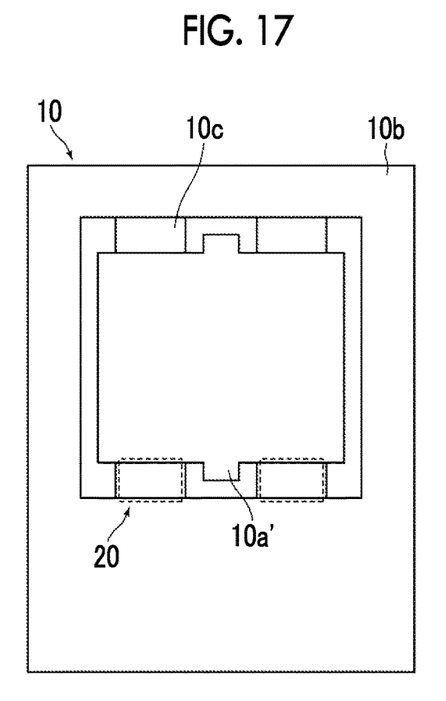
FIG. 17 is a top view illustrating still another configuration of the piezoelectric microphone according to the invention.
Figure 18:
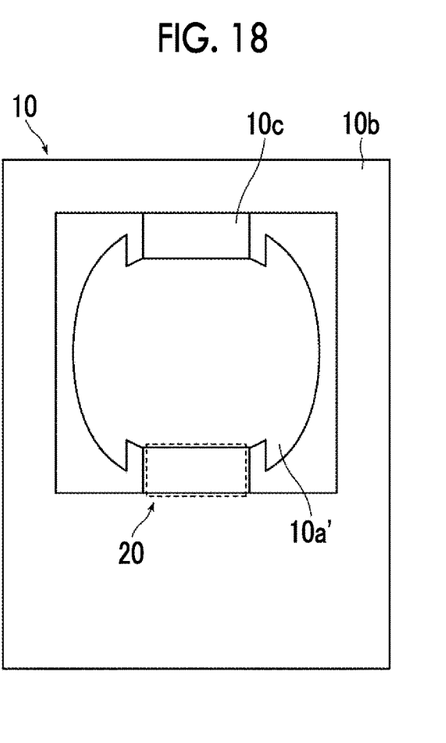
FIG. 18 is a top view illustrating yet another configuration of the piezoelectric microphone according to the invention.

The preferred embodiments of the invention have been described above. However, the invention is not limited to the above-described embodiments. For example, as illustrated in FIGS. 16, 17, and 18 (corresponding to FIGS. 4, 6, and 7, respectively), for the plate 10a that receives sound pressure, the plate 10a may extend in the direction of the support portion 10b, without changing the shape of the connection portion 10c, in order to receive sound pressure in a wider area and to increase sensitivity. In addition, the gap between the plate 10a and the support portion 10b is narrowed to reduce the possibility that sound pressure will be applied to the rear surface of the plate 10a. Therefore, it is possible to obtain the effect of suppressing a reduction in sensitivity.

In addition to the above description, various kinds of improvement and modifications may be made without departing from the scope and spirit of the invention. Explanation of References 1, 2, 3: piezoelectric microphone
10: silicon layer
10a: plate
10b: support portion
10c: connection portion
11: insulating layer
12: bridge pier portion
20, 30a, 30b, 40a, 40b, 50: detection portion 21, 31a, 31b, 41a, 41b: lower electrode
22, 32a, 32b, 42a, 42b: piezoelectric film
23, 33a, 33b, 43a, 43b: upper electrode
24, 34, 35, 44, 45: insulating layer

What is claimed is:

1. A piezoelectric microphone comprising:
a plate;
a support portion that is provided around the plate;
connection portions that connect the plate and the support portion on two or more sides of the plate; and
a detection portion including a lower electrode, a piezoelectric film, and an upper electrode which are stacked in this order,
wherein the detection portion is stacked on the connection portion, and
an inflection point of a cross-sectional deformation curve in a case in which the plate and the connection portion are deformed by sound pressure is present in a region in which the detection portion is not stacked.

2. The piezoelectric microphone according to claim 1, wherein a width of the connection portion is less than a width of the plate.

3. The piezoelectric microphone according to claim 1, wherein the connection portion and the plate have the same thickness.

4. The piezoelectric microphone according to claim 1, wherein the connection portion has a rectangular shape.

5. The piezoelectric microphone according to claim 1, wherein the piezoelectric microphone is a double-supported beam type that has the connection portion on each of two opposite sides forming a set.

6. The piezoelectric microphone according to claim 1, wherein the piezoelectric microphone satisfies the following Conditional Expression (1):

$$L1/Lp < 0.37 \times (Wt/Wp) + 0.23 \quad (1)$$

where a length of the connection portion
Lp: a length of the plate
Wt: a sum of the widths of the connection portions
Wp: a width of the plate.

7. The piezoelectric microphone according to claim 1, wherein the sum of the widths of the connection portions on one side of the plate is equal to or greater than 30% and less than 100% of the width of the plate.

8. The piezoelectric microphone according to claim 1, wherein the sum of the widths of the connection portions on one side of the plate is equal to or greater than 40% and less than 80% of the width of the plate.

9. The piezoelectric microphone according to claim 1, wherein the piezoelectric film has a relative permittivity of 1000 or more.

10. The piezoelectric microphone according to claim 1, wherein the piezoelectric film is made of Nb-PZT.

* * * * *